(12) United States Patent
Choi et al.

(10) Patent No.: US 8,053,059 B2
(45) Date of Patent: Nov. 8, 2011

(54) SUBSTRATE FOR PATTERNING AND METHOD FOR FORMING A PATTERN OF NANOCRYSTALS USING THE SAME

(75) Inventors: Seong Jae Choi, Seoul (KR); Kyung Sang Cho, Gwacheon-si (KR); Jae Young Choi, Suwon-si (KR); Dong Kee Yi, Seoul (KR); Hyeon Jin Shin, Suwon-si (KR); Seon Mi Yoon, Yongin-si (KR); In Young Song, Suwon-si (KR); Jong Hyeon Lee, Suwon-si (KR); Duk Young Jung, Suwon-si (KR); Geun Tae Cho, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 979 days.

(21) Appl. No.: 11/757,018

(22) Filed: Jun. 1, 2007

(65) Prior Publication Data
US 2008/0182072 A1  Jul. 31, 2008

(30) Foreign Application Priority Data

Jan. 26, 2007  (KR) .................... 10-2007-0008357

(51) Int. Cl.
*B32B 3/14* (2006.01)
*B32B 3/02* (2006.01)
*B05D 5/00* (2006.01)
(52) U.S. Cl. .......... 428/148; 428/690; 428/180; 428/156
(58) Field of Classification Search ............... 428/690, 428/180, 156, 148
See application file for complete search history.

(56) References Cited

U.S. PATENT DOCUMENTS

| 5,751,018 | A * | 5/1998 | Alivisatos et al. | 257/64 |
| 6,872,472 | B2 * | 3/2005 | Liao et al. | 428/690 |
| 2006/0063029 | A1 * | 3/2006 | Jang et al. | 428/690 |
| 2009/0098663 | A1 * | 4/2009 | Han et al. | 436/525 |

* cited by examiner

*Primary Examiner* — Angela Ortiz
*Assistant Examiner* — J. L. Yang
(74) *Attorney, Agent, or Firm* — Cantor Colburn LLP

(57) ABSTRACT

Provided is a substrate for forming a pattern comprising an inorganic layer having a modified surface, wherein the modified surface is formed by coating a surface of the inorganic layer with a bifunctional molecule comprising a functional group having an affinity for a nanocrystal at one end of the molecule and a functional group having an affinity for the inorganic layer at the other end of the molecule. A method for forming a pattern of nanocrystals is also provided.

10 Claims, 8 Drawing Sheets

A

SUBSTRATE FOR PATTERNING AND METHOD FOR FORMING A PATTERN OF NANOCRYSTALS USING THE SAME

CROSS-REFERENCE TO RELATED APPLICATION

This non-provisional application claims priority under 35 U.S.C. §119(a) to Korean Patent Application No. 10-2007-0008357 filed on Jan. 26, 2007, the entire contents of which are hereby incorporated by reference.

BACKGROUND OF THE INVENTION

1. Field of the Invention

The present invention relates to a substrate that can be used for the patterning of nanocrystals, and to a method for forming a pattern of nanocrystals using the substrate. More specifically, the substrate comprises an inorganic layer having a modified surface, wherein the modified surface is formed by coating a surface of the inorganic layer with a bifunctional molecule comprising a functional group having an affinity for a nanocrystal at one end of the molecule, and a functional group having an affinity for the inorganic layer at the other end of the molecule. A method for forming a pattern of nanocrystals using the substrate is also provided.

2. Description of the Related Art

A nanocrystal is a single crystal particle having a cross-section of only a few nanometers. Since a nanocrystal has a large surface area per unit volume, most of the constituent atoms of the nanocrystal are present on the surface of the nanocrystal. As a consequence of this characteristic structure, a nanocrystal exhibits quantum confinement effects and demonstrates electrical, magnetic, optical, chemical and mechanical properties that are substantially different from those inherent to the constituent atoms of the nanocrystal. In particular, semiconductor nanocrystals have high luminescence efficiency and a small half bandwidth within the photoluminescence ("PL") spectrum, making their use advantageous for application to light-emitting materials. As a result, semiconductor nanocrystals have received a great deal of attention for their potential use as materials for light-emitting layers of various electroluminescent ("EL") devices and display devices.

For example, a prior art electroluminescent device, as shown in FIG. 1A, may have a structure including a cathode 10, an electron transport layer 20, a nanocrystal light-emitting layer 30, a hole transport layer 40, and an anode 50, that are sequentially stacked on a substrate. Application of the nanocrystals as light-emitting layer materials for various display devices, as shown in FIG. 1B, shows that the nanocrystal light-emitting layer 30 be patterned into nanocrystal patterns that correspond to each red, green and blue ("RGB") wavelength. Furthermore, with the recent trend toward display devices of reduced size and weight, there is an increased demand for pattern miniaturization.

In an attempt to find techniques for forming a pattern of nanocrystals, studies have been conducted utilizing various methods that include ink-jet printing, a self-assembly method, and the like. However, recently a nanoimprinting lithography ("NIL") technique has attracted a great deal of interest across a variety of fields, including the semiconductor industry, as a promising ultra-fine patterning technique for use in nano-devices. Nanoimprinting lithography can transfer high-resolution fine patterns on a substrate through a low-cost and simple process, and therefore nanocrystal patterns can be formed in an inexpensive and effective manner.

Nanoimprinting lithography is a convenient method for forming patterns of nanocrystals by preparing a nanocrystal thin film on a patterned stamp and then repeatedly stamping the thus-formed thin film on the desired substrate. For example, according to the nanoimprinting method, patterned nanocrystal thin films can be formed on inorganic layers of inorganic electroluminescent (EL) devices. The nanocrystal thin films patterned according to the nanoimprinting lithography methods can be used for a wide variety of applications including inorganic EL devices, backlight units (BLU), nano-bio devices, and the like.

Research is currently ongoing to develop a method capable of more stably forming a desired pattern for use in nanoimprinting lithography. In this regard, the most important thing is to ensure the efficient transfer of nanocrystals, in a desired pattern, to the substrate. That is, if there is no strong attractive force between the nanocrystal thin film formed on a stamp, and the inorganic layer formed on the substrate, to which the nanocrystal thin film will be applied, the thin film is poorly transferred and remains on the stamp. Consequently, it is impossible to achieve transfer of a uniform nanocrystal pattern onto the substrate. Further, even when the nanocrystal thin film transfers sufficiently onto the substrate, it may be impossible to maintain the original uniform state of the thin film due to the separation of nanocrystals in subsequent post-treatment processes.

In an attempt to solve these problems, a method for modifying the surface of the stamp has been proposed. However, such a surface modification technique is problematic due to the high level of complexity involved.

SUMMARY OF THE INVENTION

In one embodiment, the present invention provides a substrate for forming a pattern that is capable of improving the transfer efficiency of the pattern during nanoimprinting due to the excellent affinity of the substrate for a nanocrystal thin film formed on a stamp.

In another embodiment, the present invention provides a method for forming a pattern of nanocrystals that improves the reliability of the nanocrystal thin film by ensuring the easy transfer of the nanocrystal thin film to the substrate during nanoimprinting via the presence of bifunctional molecules on a surface of the inorganic layer where the pattern of nanocrystals is to be formed.

In yet another embodiment, there is provided a substrate for forming a pattern comprising an inorganic layer having a modified surface, wherein the modified surface is a layer formed by coating the surface of the inorganic layer with a bifunctional molecule containing a functional group having an affinity for a nanocrystal at one end of the molecule, and a functional group having an affinity for the inorganic layer at the other end of the molecule.

In accordance with one aspect, the bifunctional molecule may be a compound capable of forming a self-assembled monolayer ("SAM"), particularly a compound capable of forming a SAM in which the bifunctional molecule is represented by Formula I:

[Formula I]

$$A\text{---}X\text{---}B \tag{I}$$

In Formula I, A is a functional group selected from the group consisting of acetyl, acetic acid, phosphine, phosphonic acid, alcohol, vinyl, amide, phenyl, amine, acrylic, silane, cyano, and thiol; X is a linear or branched carbon chain of about 1 to about 20 carbon atoms in length, or a siloxane chain; and B is a functional group selected from the group consisting of carboxylic acid, amine, phosphine, phosphonic acid, and thiol.

Specific examples of the bifunctional molecule of Formula I may include, a bifunctional group selected from the group consisting of 2-carboxyethylphosphonic acid, mercaptoacetic acid, mercaptohexanol, and cysteamine.

In yet another embodiment, a method is provided for forming a nanocrystal pattern comprising: contacting a stamp comprising a nano-scale concavo-convex pattern formed thereon which comprises a nanocrystal-coated surface on a substrate having an inorganic layer formed thereon, and thereby transferring and forming a nanocrystal pattern on the substrate. The method further comprises treating a surface of the inorganic layer with a bifunctional molecule containing a functional group having an affinity for a nanocrystal at one end of the molecule and a functional group having an affinity for the inorganic layer at the other end of the molecule.

In yet another embodiment, the method of forming a nanocrystal pattern comprises preparing a stamp comprising a pattern corresponding to a nanocrystal pattern to be formed on a substrate; coating nanocrystals on a surface of the patterned stamp to form a nanocrystal thin film; surface-treating an inorganic layer on the substrate with a bifunctional molecule; and contacting the stamp to the surface-treated substrate to transfer the nanocrystal pattern.

BRIEF DESCRIPTION OF THE DRAWINGS

The aforementioned features and other advantages of the present invention will be more clearly understood from the following detailed description taken in conjunction with the accompanying drawings, in which.

DETAILED DESCRIPTION OF THE PREFERRED EMBODIMENTS

Hereinafter, various exemplary embodiments of patterned substrate will be explained in greater detail with reference to the accompanying drawings.

In one embodiment, the present invention is directed to a substrate for forming a pattern, comprising an inorganic layer having a modified surface, wherein the modified surface is formed by coating a surface of the inorganic layer with a bifunctional molecule containing a functional group having an affinity for a nanocrystal at one end of the molecule, and a functional group having an affinity for the inorganic layer at the other end of the molecule.

In another embodiment, the substrate may be used in formation of the nanocrystal pattern prepared using a nanoimprinting method. For example, formation of a nanocrystal thin film on a patterned stamp, such that the thin film has negative pattern profile relative to the desired pattern to be obtained, and then stamping the thin film on the substrate of the present invention, will result in a nanocrystal thin film comprising the desired pattern.

The bifunctional molecule of the surface-modified layer on the substrate has functional groups at both end of the molecule that act as binding groups for the nanocrystals and the inorganic layer surface, respectively. Therefore, the bifunctional molecule is readily adsorbed onto the inorganic layer and readily binds the surface of the nanocrystal thin film. Consequently, the bifunctional molecule improves the transfer efficiency of the nanoparticles upon stamping, and also supports the patterned nanocrystal thin film, thereby improving the reliability of a nanocrystal light-emitting layer such that the nanocrystal pattern is not damaged in the additional post-process steps required for the fabrication of a device.

In yet another embodiment, the bifunctional molecule constituting the surface-modified layer may be a compound capable of forming a self-assembled monolayer. When the bifunctional molecule is a self-assembled monolayer-forming compound, it is possible to form a stable self-assembled monolayer on the substrate by taking advantage of chemical reaction between the bifunctional molecule and the substrate surface.

Figure 2:
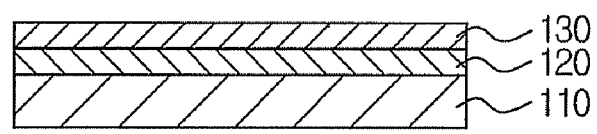
FIG. 2 is an exemplary schematic cross-sectional view of a substrate that may be used in the formation of a pattern.

FIG. 2 is a schematic cross-sectional view of a substrate that may be used in the formation of a pattern. Referring to FIG. 2, the substrate for formation of a pattern may include a substrate 110, an inorganic layer 120 formed on the substrate 110, and a surface-modified layer 130 formed on the inorganic layer 120.

According to one embodiment, the substrate 110 may be any substrate employed in conventional electronic devices. Preferably, glass substrates, silicon substrates or transparent plastic substrates may be used which have superior transparency, surface smoothness, handleability and waterproofness. Specific examples of transparent substrates include those selected from the group consisting of transparent inorganic substrates, such as quartz and glass, and transparent plastic substrates, such as polyethylene terephthalate ("PET"), polyethylene naphthalate ("PEN"), polycarbonate, polystyrene, polypropylene, polymethylmethacrylate, polyethersulfone (PES), and the like; and a combination comprising at least one of the foregoing transparent substrates. Preferably, the substrate has a thickness of about 0.3 to about 1.1 millimeters (mm).

According to another embodiment, the substrate may be coated with a conductive metal, a metal oxide or a conductive polymer as an electrode material. Specific examples of the electrode material include those selected from the group consisting of gold (Au), silver (Ag), platinum (Pt), aluminum (Al), nickel (Ni), molybdenum (Mo), tungsten (W), iridium (Ir), indium-tin oxide (ITO), indium-zinc oxide (IZO), and a combination comprising at least one of the forgoing electrode materials. Non-limiting examples of the conductive polymer may include polythiophene, polyaniline, polyacetylene, polypyrrole, polyphenylene vinylene, polyethylenedioxythiophene (PEDOT)/polystyrenesulfonate (PSS) mixtures, and a combination comprising at least one of the forgoing conductive polymers.

According to yet another embodiment, the inorganic layer 120 formed on the substrate 110 may include metal oxides or metal nitrides. For example, when the substrate used in the formation of the pattern is applied to an electroluminescent device, the inorganic layer 120 may serve as a cathode into which electrons will be injected. Suitable examples of metal oxides for use in the inorganic layer 120 include metal oxides selected from the group consisting of $TiO_2$, ZnO, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, metal nitrides such as $Si_3N_4$, and a combination comprising at least one of the foregoing metal oxides.

In one embodiment, the surface-modified layer 130 may be composed of bifunctional molecules having an affinity for nanocrystals and an inorganic layer surface. The bifunctional molecule may be a self-assembled monolayer-forming compound. Specifically, the bifunctional molecule may be a compound represented by Formula I:
[Formula I]

$$A\text{-}X\text{—}B \quad (I)$$

In Formula I, A is a functional group can be selected from the group consisting of acetyl, acetic acid, phosphine, phosphonic acid, alcohol, vinyl, amide, phenyl, amine, acrylic, silane, cyano, and thiol; X is a linear or branched carbon chain of about 1 to about 20 carbon atoms in length, or a siloxane chain; and B is a functional group selected from the group consisting of carboxylic acid, amine, phosphine, phosphonic acid and thiol.

In the bifunctional molecule of Formula I, A is a functional group having an affinity for the inorganic layer, and B is a functional group having an affinity for the nanocrystals. As such, the bifunctional molecule comprises a functional group such as phosphonic acid, having an affinity for nanocrystals at one molecular end, and contains a functional group such as carboxylic acid, having an affinity for the inorganic layer surface at the other molecular end. As a result, the bifunctional molecule can strongly bind to both the inorganic layer, e.g., metal oxides, and the semiconductor nanocrystals. Consequently, when the nanocrystal thin film formed on the stamp is transferred to the inorganic layer of the substrate, the bifunctional molecule improves the transfer efficiency and, may also serve to protect the thus-formed pattern from damage that may occur in the additional post-process steps that take place after the contacting of the nanocrystal thin film.

Examples of the bifunctional molecule of Formula I include those selected from the group consisting of 2-carboxyethylphosphonic acid, 2-carboxymethylphosphonic acid, 2-carboxypropylphosphonic acid, 2-carboxybutylphosphonic acid, mercaptoacetic acid, mercaptohexanol, cysteamine, and a combination comprising at least one of the foregoing bifunctional molecules.

In another embodiment, the substrate may be widely applied to various electronic devices that utilize nanocrystals as light-emitting layer materials. Furthermore, a nanoimprinted substrate may be used for a wide range of applications including electronic devices and optical devices such as, for example, metal-oxide-semiconductor field-effect transistors ("MOS-FETs"), single-electron memories, diffraction gratings, patterned recording media, biochips, micro-electro mechanic systems ("MEMS"), and the like.

Figure 1A:
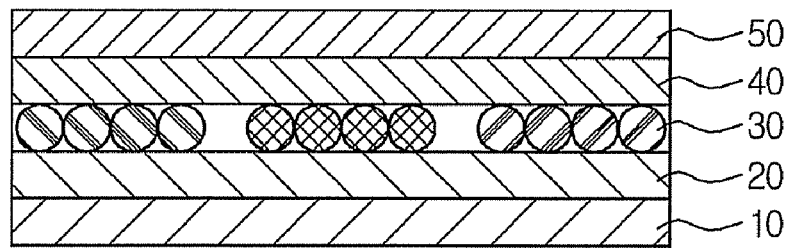
FIG. 1A is an exemplary schematic cross-sectional view of a conventional electroluminescent device.
Figure 1B:
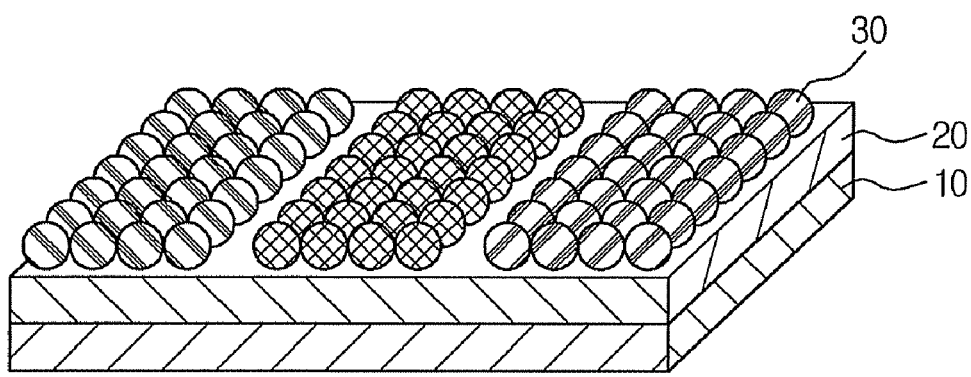
FIG. 1B is an exemplary schematic perspective view showing nanocrystal patterns of an electroluminescent device of FIG. 1A.

For example, the substrate may be used in organic or inorganic electroluminescent (EL) devices. Such EL devices comprise a separate and independent nanocrystal light-emitting layer between a hole transport layer and an electron transport layer. As shown by the exemplary embodiment in FIG. 1, the electroluminescent device comprises: a cathode 10 formed on a substrate and comprised of a conductive material; an electron transport layer 20 formed on the cathode 10; a nanocrystal light-emitting layer 30 formed on the electron transport layer 20 and comprised of nanocrystals; a hole transport layer 40 formed on the nanocrystal light-emitting layer 30; and, an anode 50.

When a voltage is applied to the two electrodes of the device, the anode 50 injects holes into the hole transport layer 40, and the cathode 10 injects electrons into the electron transport layer 20. The injected holes and electrons combine to form excitons, after which the excitons recombine to thereby emit light. Optionally, a hole injection layer (HIL) may be interposed between the anode 50 and the hole transport layer 40; or an electron blocking layer (EBL), a hole blocking layer (HBL), or an electron/hole blocking layer may be interposed between the hole transport layer 40 and the nanocrystal light-emitting layer 30; or an electron blocking layer (EBL), a hole blocking layer (HBL), or an electron/hole blocking layer may be interposed between the nanocrystal light-emitting layer 30 and the electron transport layer 20.

In yet another embodiment, the material for the hole transport layer 40 may be any material which is conventionally used in the art. Suitable examples of the hole transport layer material include at least one selected from the group consisting of poly(3,4-ethylenedioxythiophene/polystyrene parasulfonate ("PEDOT-PSS") derivatives, poly-N-vinylcarbazole derivatives, polyphenylenevinylene derivatives, polyparaphenylene derivatives, polymethacrylate derivatives, poly(9,9-octylfluorene) derivatives, poly(spiro-fluorene) derivatives, and a combination of one or more of the foregoing hole transport layer materials.

In accordance with one aspect, the material for the electron transport layer 20 may be any material that is conventionally used in the art. Suitable examples of the electron transport layer materials include at least one selected from the group consisting of oxazoles, isoxazoles, triazoles, isothiazoles, oxidiazoles, thiadiazoles and perylenes, and aluminum complexes such as tris-8-(hydroxyquinoline) aluminum (Alq3), Balq, Salq, Almq3, and a combination of one or more of the foregoing electron transport layer materials.

In accordance with another aspect, the material for the electron blocking layer, hole blocking layer and electron/hole blocking layer may also be any conventional material used in the art. Suitable examples of suitable layer materials include at least one selected from the group consisting of 3-(Biphenyl-4-yl)-4-phenyl-5-(4-tert-butylphenyl)-1,2,4-triazole (TAZ), 2,9-dimethyl-4,7-diphenyl-1,10-phenanthroline (BCP), phenanthrolines, imidazoles, triazoles, oxadiazoles, and aluminum complexes.

In accordance with yet another aspect, suitable examples of materials for the cathode 10 include low-work function metals capable of effecting easy electron injection at least one of which is selected from the group consisting of Ca, Ba, Ca/Al, LiF/Ca, LiF/Al, $BaF_2$/Al, $BaF_2$/Ca/Al, Al, Mg, an Ag:Mg alloy, and a combination of one or more of the foregoing metals.

In one embodiment, the nanocrystals that can be used include most kinds of nanocrystals synthesized by a wet process, such as metal nanocrystals, semiconductor nanocrystals, and the like. Suitable examples of the material for the nanocrystal light-emitting layer 30 of the present invention may be at least one selected from the group consisting of metal nanocrystals including Au, Ag, Pt, Pd, Co, Cu, Mo and alloys thereof, Group II-VI compound semiconductor nanocrystals including CdS, CdSe, CdTe, ZnS, ZnSe, ZnTe, HgS, HgSe, HgTe and alloys thereof, Group III-V compound semiconductor nanocrystals including GaN, GaP, GaAs, InP, InAs and alloys thereof, PbS, PbSe, PbTe and alloys thereof, and a combination of one or more of the foregoing metal nanocrystals.

In another embodiment, the present invention is directed to a method for forming a pattern of nanocrystals.

In yet another embodiment, the method enables the convenient fabrication of micro-scale, or nano-scale, nanocrystal patterns. As a result, the method can be utilized across a varied and wide range of potential applications in the electronic fields, including electroluminescent devices, display devices, and the like, as well as in the chemical and biological fields.

Figure 3A:
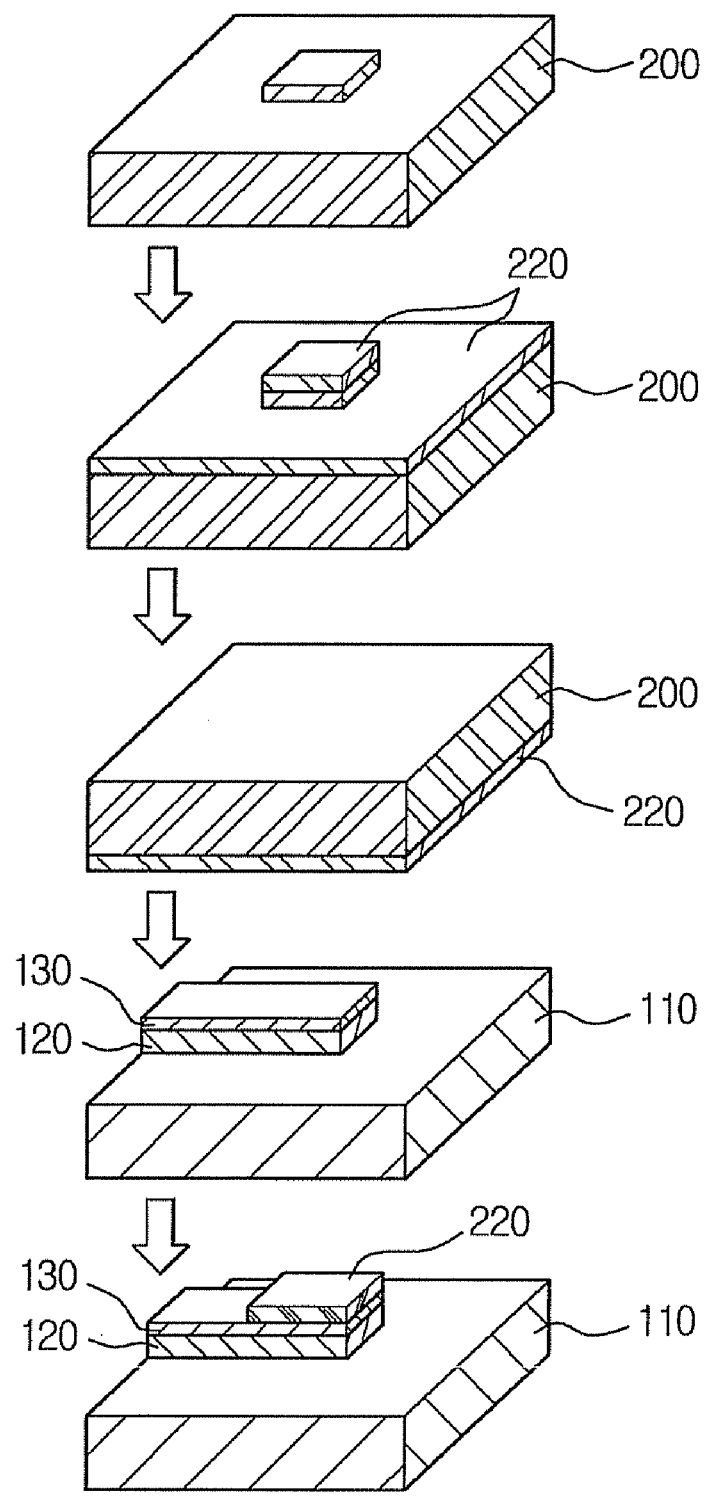
FIG. 3A is an exemplary schematic process view illustrating a method for the formation of nanocrystal patterns.
Figure 3B:
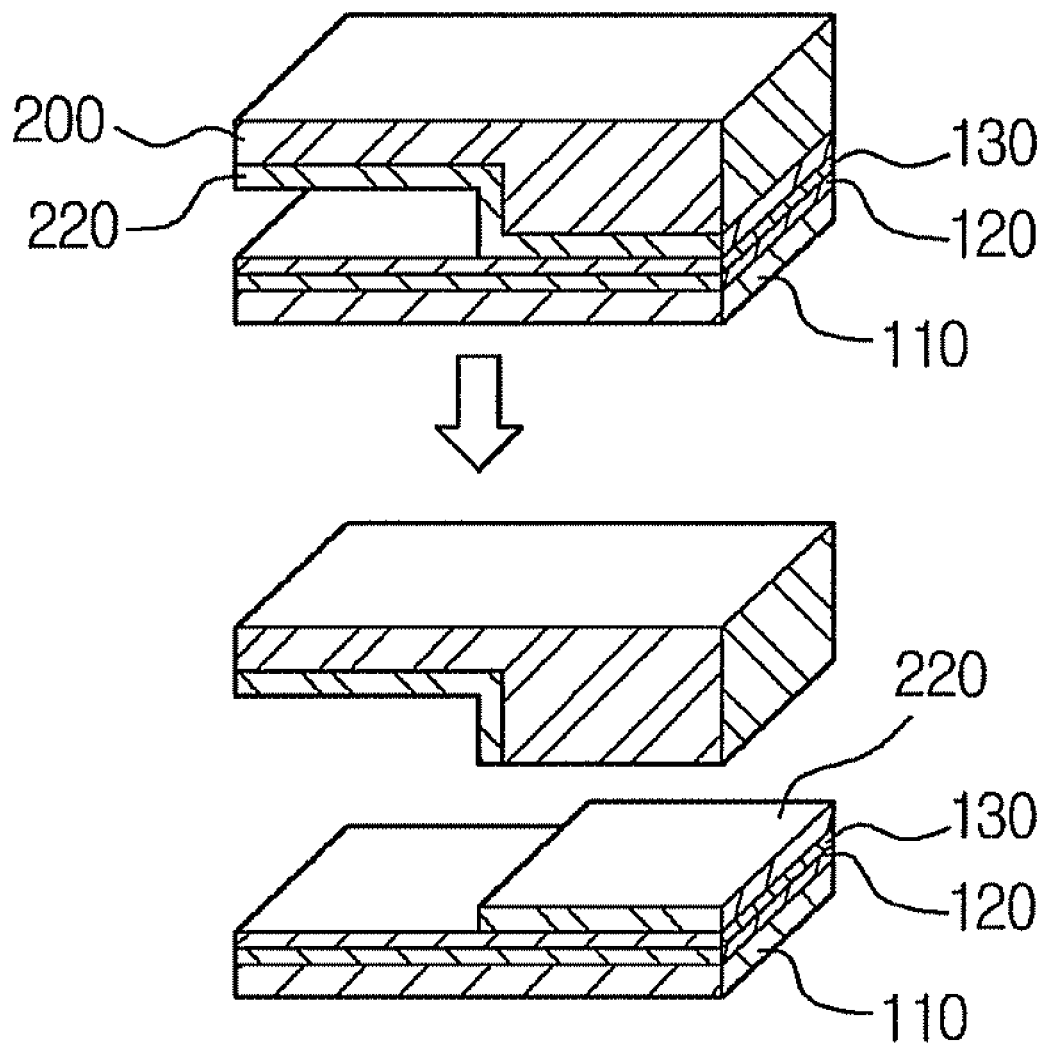
FIG. 3B is an exemplary schematic process view illustrating details of the nanocrystal contacting step as outlined in the method of FIG. 3A.

FIG. 3A is an exemplary schematic process view illustrating a method for the formation of nanocrystal patterns, and FIG. 3B is an exemplary schematic process view illustrating details of the nanocrystal contacting step illustrated in the method of FIG. 3A.

Hereinafter, the nanocrystal patterning method will be explained in more detail with reference to FIGS. 3A and 3B.

In one embodiment, in order to form a nanocrystal pattern on a substrate, there is first provided a stamp 200 comprising a pattern 220 corresponding to the nanocrystal pattern that is to be formed on the substrate. The stamp 200 may be formed of a material selected from the group consisting of polydimethylsiloxane ("PDMS"), polyimide ("PI"), and polymethylmethacrylate ("PMMA"). A preferred material is PDMS. Polydimethylsiloxane is transparent, exhibits low reactivity and low interfacial energy with polymeric materials, is capable of maintaining constant contact even with an irregular surface due to good elasticity, and can be easily separated from the susbtrate without causing distortion of the pattern after completion of pattern formation.

For preparing the stamp 200, a pattern having a negative pattern profile relative to the desired pattern to be obtained on the substrate, is formed on the stamp. Nanocrystals 220 are subsequently coated on the surface of the pattern to form a nanocrystal thin film on the patterned stamp. The nanocrystals 220 that can be used herein include are those selected from the group consisting of metal nanocrystals including Au, Ag, Pt, Pd, Co, Cu, Mo and alloys thereof, Group II-VI compound semiconductor nanocrystals including CdS, CdSe, CdTe, ZnS, ZnSe, ZnTe, HgS, HgSe, HgTe and alloys thereof, Group III-V compound semiconductor nanocrystals including GaN, GaP, GaAs, InP, InAs and alloys thereof, PbS, PbSe, PbTe and alloys thereof.

There is no particular limitation to the method that can be used for the formation of a nanocrystal thin film on the patterned stamp. For example, formation of the film may be carried out using any conventional method known in the art, including spin coating, dip coating, spray coating, and blade coating.

In another embodiment, a substrate for the formation of a nanocrystal pattern is prepared. A conductive material is coated on a substrate 110 on which a metal oxide, a metal nitride, or the like, is then applied to form an inorganic layer 120 by using a solution coating method. The solution coating method is selected from the group consisting of sol-gel coating, spin coating, printing, casting and spraying, or a vapor-phase coating method selected from the group consisting of chemical vapor deposition ("CVD"), sputtering, e-beam evaporation and vacuum deposition.

Bifunctional molecules are then coated on the surface of the inorganic layer 120, formed on the substrate 110, in order to form a surface-modified layer 130. The bifunctional molecule used herein is a molecule containing the same or different functional groups having affinities at both ends of the molecule for nanocrystals and the inorganic layer, respectively. For example, the bifunctional molecule can be used which is represented by Formula I.

In yet another embodiment, there is no particular limitation to the method that can be used for the formation of the surface-modified layer 130 via surface treatment of the bifunctional molecule on the surface of the inorganic layer 120. For example, the surface treatment may be carried out using a vapor-phase coating method or a wet coating method.

The wet coating method is performed using a solution obtained by dissolving the bifunctional molecules in water, an organic solvent, or a mixture of water and solvent. The thus-prepared solution contains preferably about 0.001 weight percent (wt %) to about 10 wt % of bifunctional molecules, more preferably about 0.01 wt % to about 1 wt % of bifunctional molecules.

Examples of the organic solvent that can be used in the present invention include those selected from the group consisting of pyridine, ethanol, propanol, butanol, pentanol, hexanol, toluene, chloroform, chlorobenzene, THF, cyclohexane, cyclohexene, methylene chloride, pentane, hexane, heptane, octane, nonane, decane, undecane, dodecane, and a combination comprising at least one of the foregoing solvents.

In accordance with one aspect, the treatment solution may be applied using a solution coating method selected from the group consisting of spin coating, dip coating, spray coating, a dispensing or sol-gel method, printing and casting, or a vapor-phase coating method selected from at least one of the group consisting of chemical vapor deposition ("CVD") and vacuum deposition. Treatment of the bifunctional molecules may be carried out at a temperature of about 10° C. to about 150° C. for about 10 min to about 1 hour.

In accordance with another embodiment, the stamp and substrate are prepared, the stamp is then contacted or pressed onto the substrate, resulting in the formation of a nanocrystal pattern 220. The stamping method used is not particularly limited and is carried out, for example, by applying a pressure to the stamp in contact with the top surface of the substrate, followed by heat treatment or UV exposure. Alternatively, stamping may also be performed using microcontact printing, in which transfer of the pattern is effected by closely contacting the stamp with the substrate without any particular heat treatment or UV treatment (see FIG. 3B).

In accordance with yet another aspect, the method for the formation of a nanocrystal pattern may be applied to the fabrication of various electroluminescent devices and display devices using nanocrystals as the light-emitting materials, as well as to the fabrication of nano-grade metal oxide semiconductors, MOS-FETs, MESFET, high-density magnetic storage devices, super-high-speed single-electron transistor memories, nano-bio devices, and the like.

Figure 4:
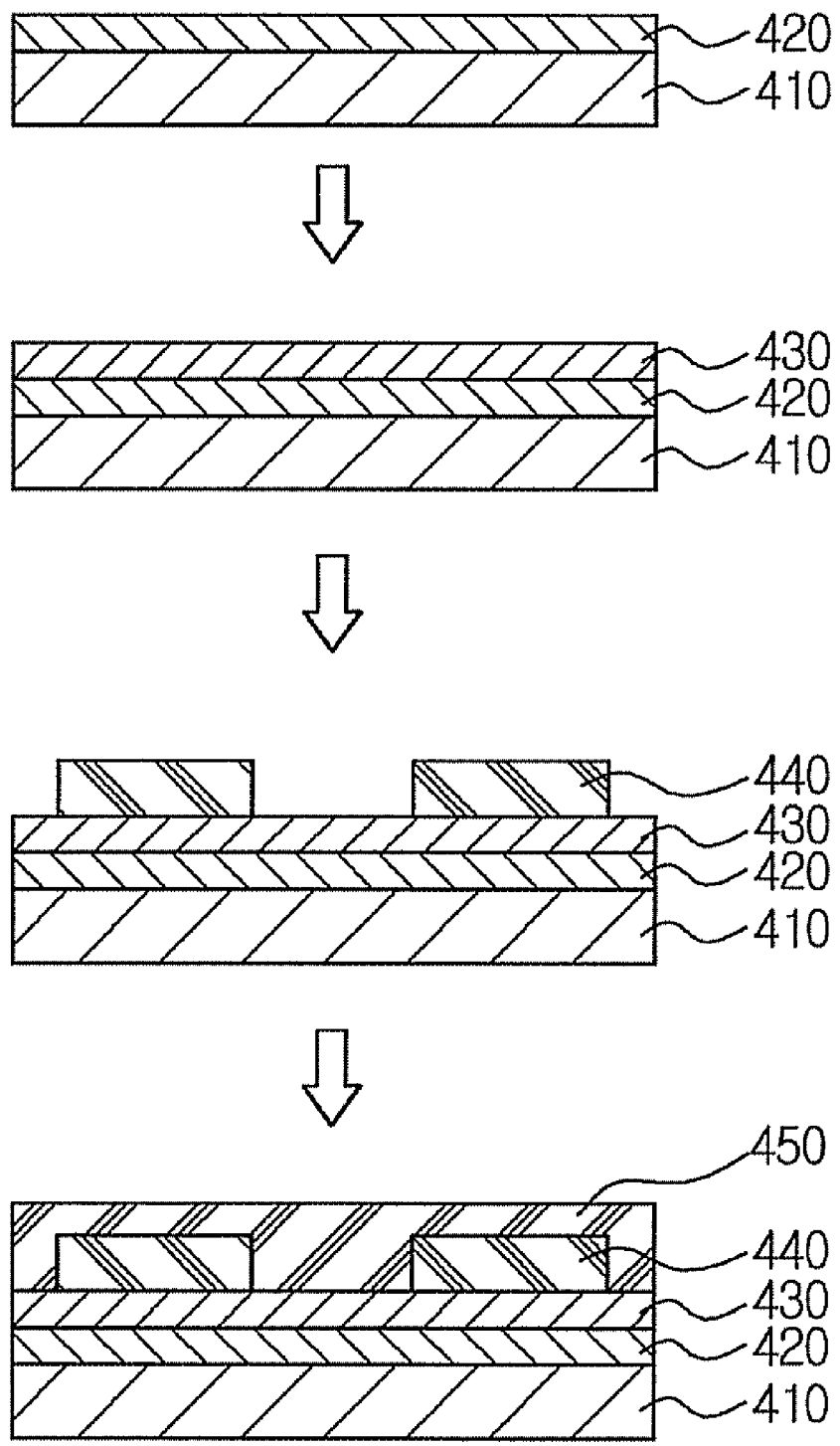
FIG. 4 is an exemplary schematic process view illustrating the fabrication of an electroluminescent device using the nanocrystal patterning method.

For example, FIG. 4 is an exemplary schematic process view illustrating the fabrication of an electroluminescent device using the nanocrystal patterning method. With regard to FIG. 4, an electron transport layer 420, made of an inorganic material such as a metal oxide or the like, is formed on an anode 410 which was formed by coating a conductive material on a substrate. Then, the bifunctional molecules are coated on the surface of the thus-formed electron transport layer 420 to form a surface-modified layer 430. Following the formation of the surface-modified layer 430, a stamp comprising a pattern corresponding to a pattern to be formed on a substrate, and comprising a nanocrystal thin film formed on the surface thereof, is stamped on the substrate resulting in the formation of a nanocrystal light-emitting layer 440 on the surface-modified layer 430. Thereafter, a hole transport layer 450, and a cathode, are formed on the nanocrystal light-emitting layer 440.

According to one embodiment, in fabrication of the electroluminescent device, a hole injection layer may be inserted between the anode and the hole transport layer; or an electron blocking layer may be inserted between the hole transport layer and the nanocrystal light-emitting layer; or a hole blocking layer may be inserted between the nanocrystal light-emitting layer and the electron transport layer.

Now, exemplary embodiments of the present invention will be described in more detail with reference to the following examples. These examples are provided merely for the purpose of illustration and thus are not be construed as limiting the scope and spirit of the present invention.

EXAMPLES

Example 1

A Sylgard 184 silicone elastomer base (Dow Corning) and a curing agent were mixed at a weight ratio of 10:1 and stirred for 5 minutes (min). Bubbles were removed using a vacuum pump and the mixture was dropped on a wafer. The wafer, which had been previously prepared and patterned was purchased from Lg Siltron Co. Ltd. Then, the wafer was cured in an oven at 80° C. for 1 hour and removed to prepare a PDMS stamp.

A dispersion of CdSe/ZnS (Evidot, emission wavelength: 600 nm; EvidentTech) nanoparticles in hexane (1 wt %) was dropped on the PDMS stamp that had been washed with isopropyl alcohol, and was spin-coated at 4000 rpm for 20 seconds (sec) to form a nanocrystal thin film on the PDMS stamp.

An indium tin oxide-("ITO") patterned glass substrate was sequentially washed with a neutral detergent, deionized water, water and isopropyl alcohol and subjected to UV-ozone treatment. The percentage of isopropyl alcohol was 99 wt %. The UV treatment was performed for 10 minutes. Then, the prepared substrate was placed in a solution of 2-carboxy-ethylphosphonic acid (Aldrich) (diluted to 50 millimoles (mM) in ethanol), for 2 hours, and the solution was sufficiently adsorbed by the substrate. The substrate was washed with ethanol and subjected to heat treatment at 100° C. for 10 min. The resulting CdSe/ZnS nanoparticle-arranged stamp was in contact with the surface-treated substrate for 30 sec, detached, and then subjected to heat treatment at about 100° C. for about 5 min to prepare a nanocrystal-patterned substrate.

Comparative Example 1

A nanocrystal-patterned substrate was prepared in the same manner as in Example 1, except that the surface of an inorganic layer was not subjected to surface treatment.

Experimental Example 1

(1) Light Microscopic Examination

Figure 5:
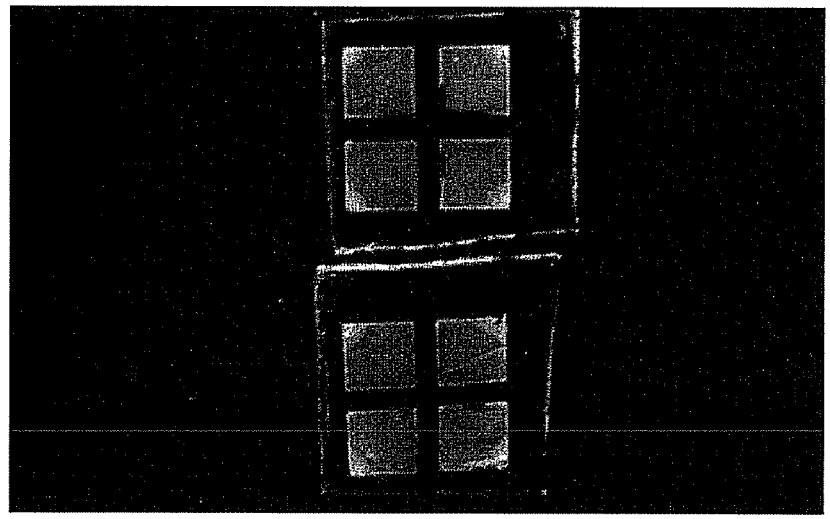
FIG. 5 is a light micrograph of the substrate used for the formation of the pattern prepared in Example 1.
Figure 6:
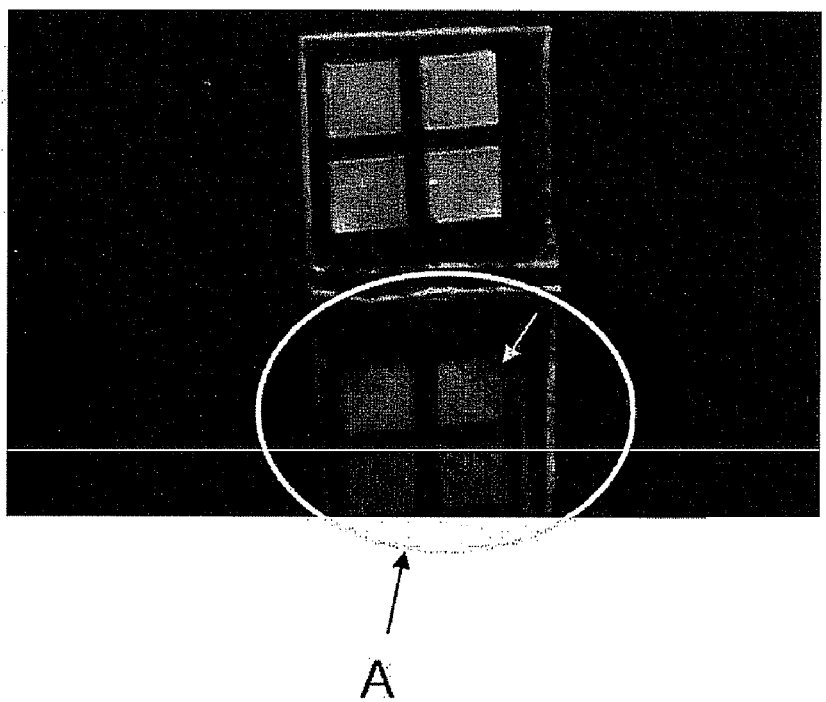
FIG. 6 is a light micrograph of the substrate used for the formation of the pattern prepared in Comparative Example 1.

The nanocrystal-patterned substrates prepared in Example 1 and Comparative Example 1, were subjected to light irradiation at 365 nanometers (nm), and the red luminescence was photographed and subsequently examined under a light microscope. FIG. 5 is a light micrograph showing results for the nanocrystal pattern obtained in Example 1, wherein the top micrograph was obtained after treatment with a bifunctional compound, and the bottom micrograph was obtained after washing with hexane. FIG. 6 is a light micrograph showing results for the nanocrystal pattern obtained in Comparative Example 1, wherein the top micrograph was obtained after treatment with a bifunctional compound, and the bottom micrograph was obtained after washing with hexane.

Upon comparing the micrographs of FIGS. 5 and 6, it can be seen that the substrate of Example 1 maintains a uniform nanoparticle thin film in an intact state such that there is no separation of the nanoparticles from the substrate even after hexane washing, whereas the substrate of Comparative Example 1, exhibits a non-uniform nanoparticle thin film due to the separation of some nanoparticles after hexane washing. The area of separation can be observed in the region defined by Circle A in FIG. 6.

(2) Scanning Electron Microscopic Examination

Figure 7A:
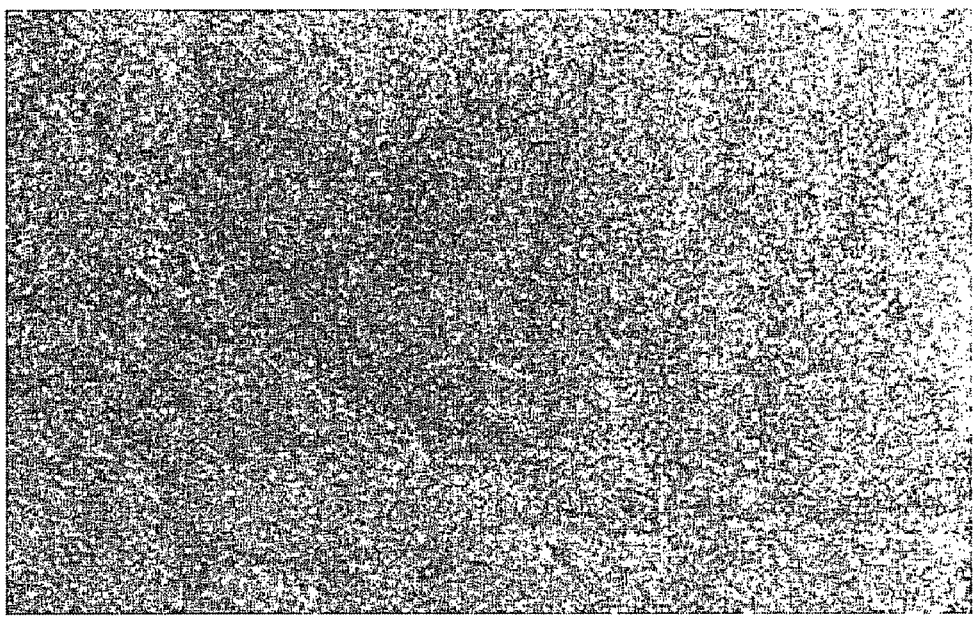
FIGS. 7A and 7B are scanning electron micrographs (SEMs) of the substrate used in the formation of the pattern produced in Example 1.
Figure 7B:
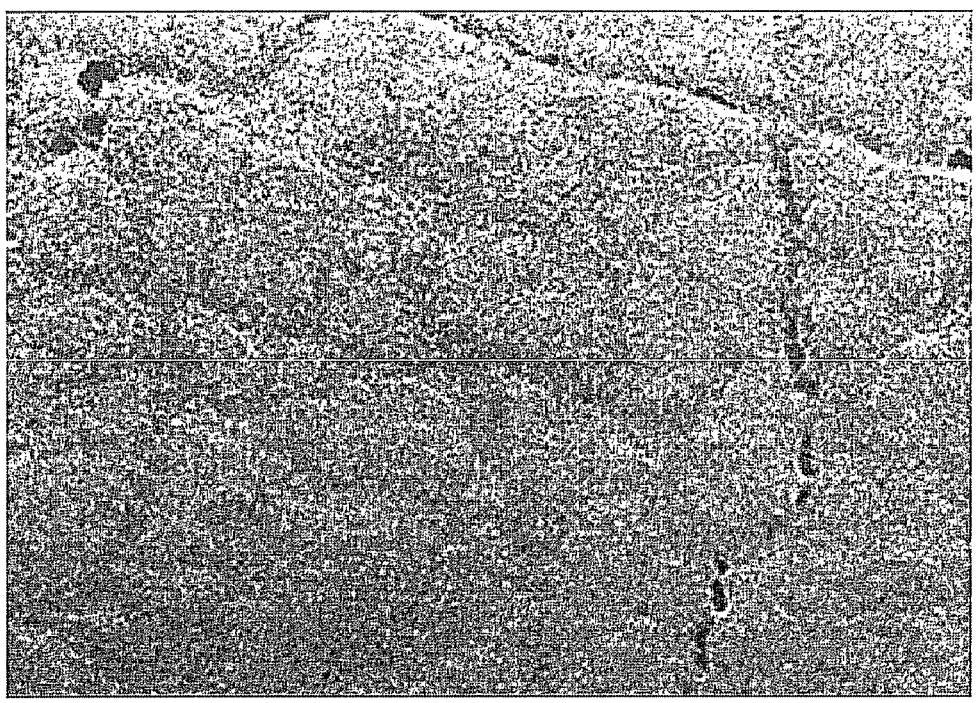

Nanocrystal-patterned substrates prepared in Example 1 and Comparative Example 1, were examined under a scanning electron microscope ("SEM"). The results are shown in FIGS. 7 and 8. FIGS. 7A and 7B are SEM micrographs of the nanocrystal pattern obtained in Example 1, wherein FIG. 7A is a micrograph obtained after treatment with a bifunctional compound, and FIG. 7B is a micrograph obtained after washing with hexane.

Figure 8A:
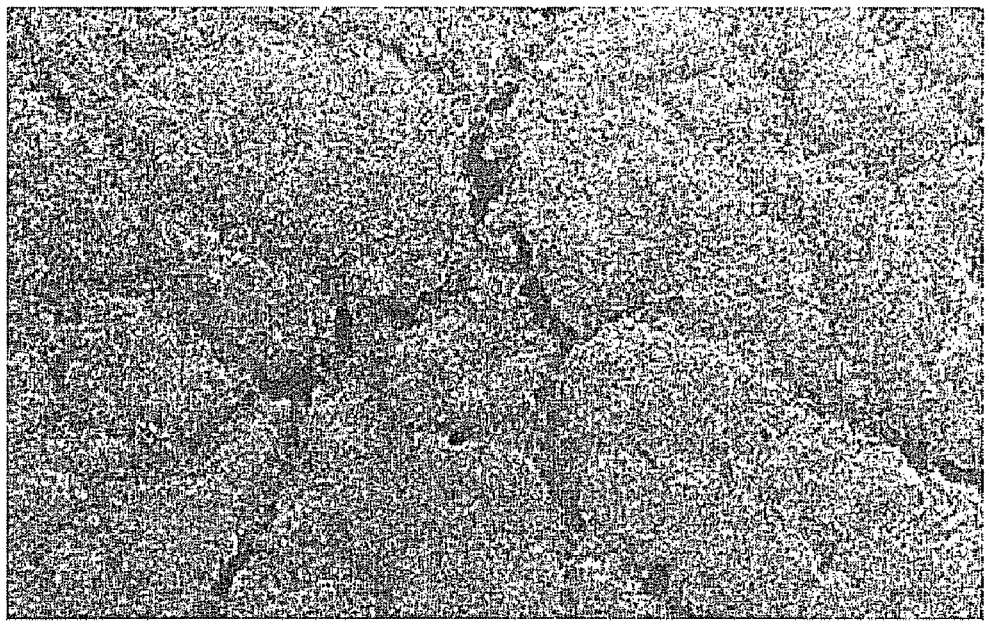
FIGS. 8A and 8B are scanning electron micrographs (SEMs) of the substrate used for the formation of the pattern produced in Comparative Example 1.
Figure 8B:
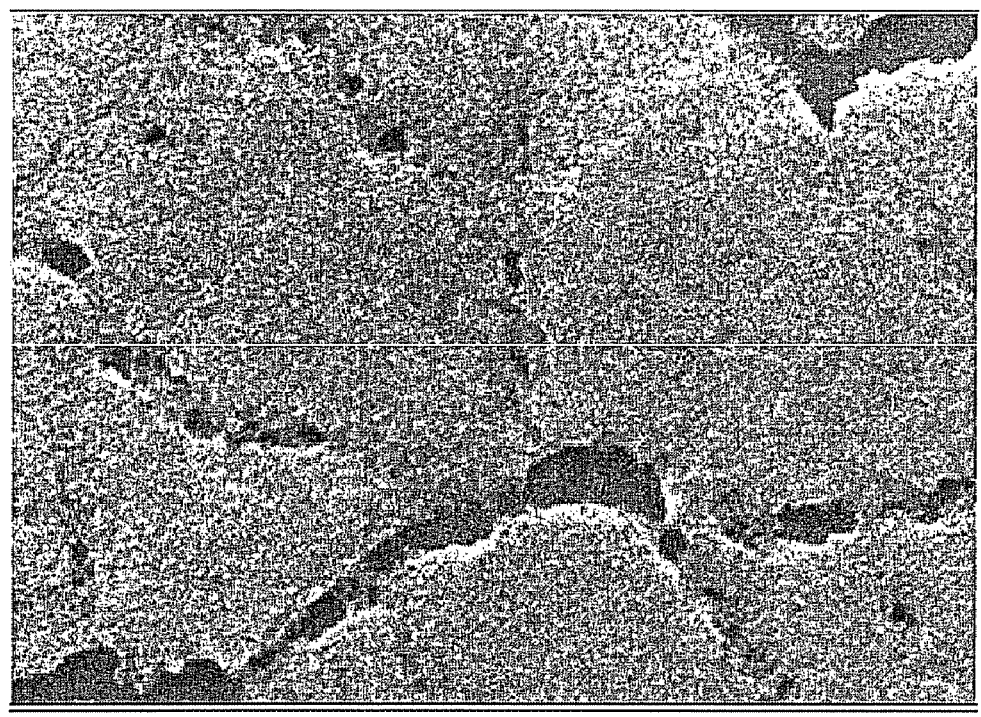

FIGS. 8A and 8B are SEM micrographs of the nanocrystal pattern obtained in Comparative Example 1, wherein FIG. 8A is a micrograph obtained after treatment with a bifunctional compound, and FIG. 8B is a micrograph obtained after washing with hexane.

Upon observing the micrographs of FIGS. 7A and 7B, it can be seen that the substrate of Example 1 exhibits a nanoparticle thin film which is substantially free of cracks, and which exhibits only a minimal number of cracks after hexane washing. This result is likely due to the excellent transfer efficiency of the nanoparticle thin film upon stamping. On the other hand, in the micrographs of FIGS. 8A and 8B, it can be seen that the substrate of Comparative Example 1 exhibits a significant number of cracks within the nanoparticle thin film that has been transferred to the substrate, and a further increase in size of the cracks after hexane washing.

(3) Observation of Luminescence Spectra

The luminescence spectra of nanocrystal-patterned substrates prepared in Example 1 and Comparative Example 1 were observed. The results are shown in FIGS. 9 and 10.

Figure 9:
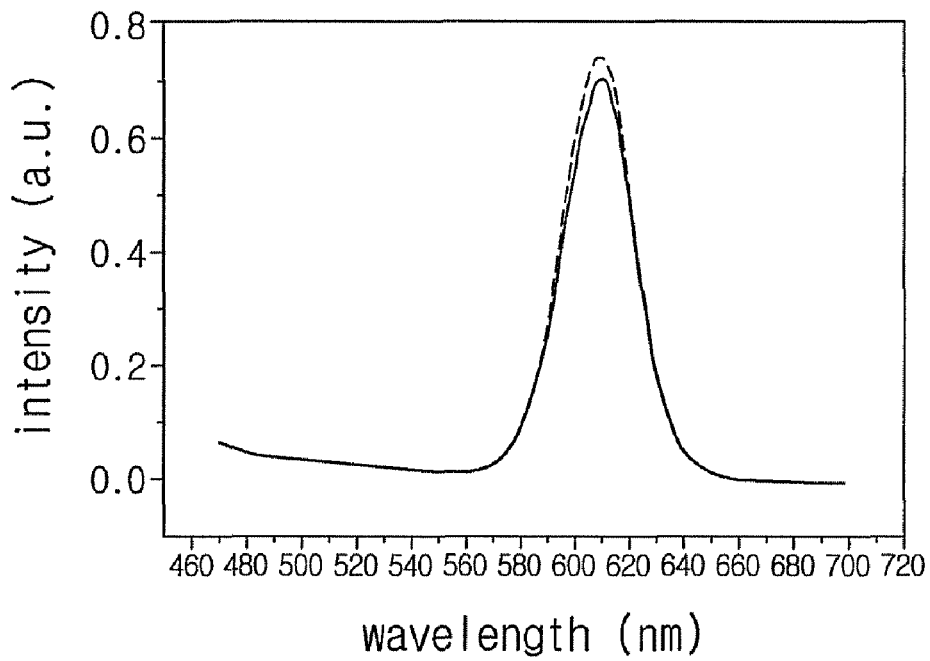
FIG. 9 is the luminescence spectrum for the substrate used in the formation of the pattern produced in Example 1.
Figure 10:
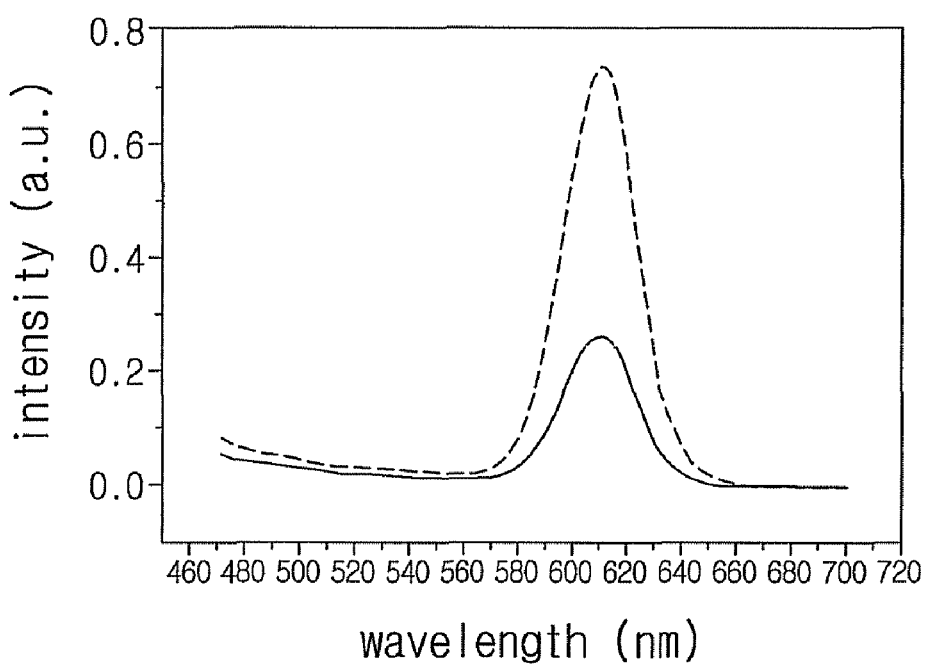
FIG. 10 is the luminescence spectrum for the substrate used in the formation of the pattern produced in Comparative Example 1.

FIG. 9 is the luminescence spectrum of the substrate prepared in Example 1, and FIG. 10 is the luminescence spectrum of the substrate prepared in Comparative Example 1.

In FIG. 9 the broken line represents the spectrum measured immediately after stamping, and the solid line represents the spectrum measured after hexane washing. Meanwhile, in FIG. 10 the broken line represents the spectrum measured immediately after stamping, and the solid line represents the spectrum measured after hexane washing.

Upon comparison of the spectral results in FIGS. 9 and 10, it can be seen that the substrate of Example 1 exhibits substantially no change in luminescence intensity before and after hexane washing, whereas the substrate of Comparative Example 1 exhibits a sharp decrease in luminescence intensity after benzene washing, even though the luminescence intensity immediately after stamping was similar the intensity of the substrate of Example 1.

As can be seen from the results of Experimental Example 1, it is possible to obtain a uniform patterned nanoparticle thin film, which is substantially free of cracks. This result is due to the excellent nanoparticle transfer efficiency that occurs when nanoimprinting is carried out using a substrate in which the inorganic layer has been surface-treated with bifunctional molecules. The resulting nanoparticle thin film is not damaged even after downstream processes such as washing.

As is apparent from the above description, the method for the formation of a nanocrystal pattern, according to the present invention, enables the batch transfer of fine nanocrystal patterns onto a substrate via a simplified process using inexpensive equipment and thereby enabling the formation of large-area, ultrafine patterns.

Further, according to the method of the present invention, it is possible to improve the transfer efficiency of a nanocrystal thin film upon stamping, and it is also possible to support the patterned nanocrystal thin film to thereby improve the reliability of a nanocrystal light-emitting layer, such that the nanocrystal pattern is not damaged in the downstream processes of device fabrication.

Although the preferred embodiments of the present invention have been disclosed for illustrative purposes, those skilled in the art will appreciate that various modifications, addition and substitutions are possible, without departing from the scope and spirit of the invention as disclosed and claimed in the accompanying claims.

What is claimed is:

1. A substrate for forming a pattern comprising:
an inorganic layer having a modified surface, wherein the modified surface is formed by coating a surface of the inorganic layer with a bifunctional molecule comprising a functional group that has an affinity for a nanocrystal at one end of the molecule and a functional group that has an affinity for the surface of the inorganic layer at the other end of the molecule, where the functional group that has affinity for the inorganic layer is selected from the group consisting of acetyl, acetic acid, phosphine, phosphonic acid, alcohol, vinyl, amide, phenyl, amine, acrylic, silane, thiol and cyano and the functional group that has affinity for the surface of the nanocrystal is selected from the group consisting of carboxylic acid, amine, phosphine, and phosphonic acid.

2. The substrate of claim 1, wherein the bifunctional molecule is a compound capable of forming a self-assembled monolayer.

3. The substrate of claim 1, wherein the bifunctional molecule is represented by Formula I:

[Formula I]

$$A\text{-}X\text{—}B \qquad (I)$$

wherein A is a functional group selected from the group consisting of acetyl, acetic acid, phosphine, phosphonic acid, alcohol, vinyl, amide, phenyl, amine, acrylic, silane, cyano, and thiol; X is a linear or branched carbon chain of from about 1 to about 20 carbon atoms in length, or a siloxane chain; and B is a functional group selected from the group consisting of carboxylic acid, amine, phosphine, and phosphonic acid.

4. The substrate of claim 3, wherein the bifunctional molecule is selected from the group consisting of 2-carboxyethylphosphonic acid, mercaptohexanol, and cysteamine.

5. The substrate of claim 1, wherein the substrate is a glass substrate, a silicon substrate or a plastic substrate, and is coated with an electrically conductive material.

6. The substrate of claim 1, wherein the inorganic layer is formed of a material selected from the group consisting of metal oxides, metal nitrides, and a combination comprising at least one of the foregoing.

7. The substrate of claim 6, wherein the inorganic layer is formed of a metal oxide selected from the group consisting of $TiO_2$, $ZnO$, $SiO_2$, $SnO_2$, $WO_3$, $Ta_2O_5$, $BaTiO_3$, $BaZrO_3$, $ZrO_2$, $HfO_2$, $Al_2O_3$, $Y_2O_3$, and $ZrSiO_4$, or a metal nitride such as $Si_3N_4$, a combination of one or more of the foregoing metal oxides.

8. An electroluminescent device comprising the substrate of claim 1 and a nanocrystal light-emitting layer.

9. The EL device of claim 8, wherein the device is an inorganic EL device or an organic EL device.

10. The EL device of claim 8, wherein the nanocrystal light-emitting layer comprises nanocrystals selected from the group consisting of: metal nanocrystals including Au, Ag, Pt, Pd, Co, Cu, Mo and alloys thereof; Group II-VI compound semiconductor nanocrystals including CdS, CdSe, CdTe, ZnS, ZnSe, ZnTe, HgS, HgSe, HgTe and alloys thereof; Group III-V compound semiconductor nanocrystals including GaN, GaP, GaAs, InP, InAs and alloys thereof; PbS, PbSe, PbTe and alloys thereof.

* * * * *